(12) United States Patent
Umemura et al.

(10) Patent No.: US 9,136,721 B2
(45) Date of Patent: Sep. 15, 2015

(54) POWER SUPPLY DEVICE FOR ELECTRIC POWER TOOL

(75) Inventors: Takuya Umemura, Anjo (JP); Toru Yamada, Anjo (JP); Hitoshi Suzuki, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 363 days.

(21) Appl. No.: 13/805,964

(22) PCT Filed: Jun. 23, 2011

(86) PCT No.: PCT/JP2011/064458
§ 371 (c)(1),
(2), (4) Date: Dec. 20, 2012

(87) PCT Pub. No.: WO2011/162357
PCT Pub. Date: Dec. 29, 2011

(65) Prior Publication Data
US 2013/0099722 A1    Apr. 25, 2013

(30) Foreign Application Priority Data

Jun. 23, 2010 (JP) ................................. 2010-142720

(51) Int. Cl.
*H02J 7/00* (2006.01)
*H02J 9/00* (2006.01)
(Continued)

(52) U.S. Cl.
CPC ................. *H02J 7/0052* (2013.01); *B25F 5/00* (2013.01); *H01L 35/30* (2013.01); *H01M 6/50* (2013.01); *H01M 10/44* (2013.01); *H01M 10/46* (2013.01);
(Continued)

(58) Field of Classification Search
CPC ............. H02J 7/00; H02J 9/00; H02J 7/0052; H02J 7/14; H02J 7/0036; H02J 7/34; H02J 7/004; H01M 10/44; H01M 10/46; H01M 6/50; H01L 35/30; H02K 7/14; B25F 5/00
USPC .......... 320/101, 114, 128, 135, 137; 136/205; 323/371; 310/50; 307/66
See application file for complete search history.

(56) References Cited

U.S. PATENT DOCUMENTS 4,251,735 A * 2/1981 Coleman ......................... 307/46
6,104,162 A   8/2000 Sainsbury et al.
(Continued)

FOREIGN PATENT DOCUMENTS

CN          1820389 A    8/2006
CN        101622102 A    1/2010
(Continued)

OTHER PUBLICATIONS

Office Action issued in Chinese Patent Application No. 201180030906.2 dated Jul. 1, 2014 (with translation).
(Continued)

*Primary Examiner* — Phallaka Kik
(74) *Attorney, Agent, or Firm* — Oliff PLC

(57) ABSTRACT

The present invention is a power supply device for electric power tool that supplies an electric power to an electric power tool. The power supply device includes: an adapter configured to be electrically connected to the electric power tool; and a fuel cell configured to generate an electric power to be supplied to the electric power tool through the adapter, by causing an oxidation reaction between a fuel and an oxidant.

10 Claims, 12 Drawing Sheets

(51) Int. Cl.
   *H01M 10/44* (2006.01)
   *H01M 10/46* (2006.01)
   *H01M 6/50* (2006.01)
   *H01L 35/30* (2006.01)
   *H02K 7/14* (2006.01)
   *B25F 5/00* (2006.01)
   H02J 7/34 (2006.01)
   H02J 1/00 (2006.01)

(52) U.S. Cl.
   CPC  *H02J 7/0036* (2013.01); *H02J 7/34* (2013.01); *H02J 2001/004* (2013.01); *H02K 7/14* (2013.01)

(56) References Cited

U.S. PATENT DOCUMENTS

| | | | |
|---|---|---|---|
| 7,196,492 B2 * | 3/2007 | Sugiura et al. | 320/101 |
| 2005/0008903 A1 | 1/2005 | Bourilkov et al. | |
| 2005/0040785 A1 * | 2/2005 | Barnes et al. | 320/101 |
| 2005/0092617 A1 * | 5/2005 | Lecky | 205/337 |
| 2005/0110453 A1 * | 5/2005 | Lecky | 320/101 |
| 2008/0110953 A1 | 5/2008 | Gibson et al. | |
| 2008/0297113 A1 * | 12/2008 | Saeki et al. | 320/128 |
| 2009/0033062 A1 | 2/2009 | Goettker | |
| 2009/0102430 A1 * | 4/2009 | Marguery et al. | 320/162 |
| 2009/0258270 A1 * | 10/2009 | Kizaki | 429/24 |
| 2010/0065295 A1 * | 3/2010 | Aradachi et al. | 173/217 |
| 2010/0316922 A1 * | 12/2010 | Hamada et al. | 429/432 |
| 2011/0169455 A1 | 7/2011 | Nagase | |
| 2012/0086278 A1 * | 4/2012 | Kanie et al. | 307/66 |
| 2012/0122017 A1 * | 5/2012 | Mills | 429/504 |

FOREIGN PATENT DOCUMENTS

| | | | |
|---|---|---|---|
| JP | A-7-65868 | 3/1995 | |
| JP | A-2001-145276 | 5/2001 | |
| JP | 2004253220 A * | 9/2004 | H01M 8/04 |
| JP | A-2004-289973 | 10/2004 | |
| JP | 2005-278375 A | 10/2005 | |
| JP | A-2006-122463 | 5/2006 | |
| JP | A-2008-67496 | 3/2008 | |
| JP | A-2008-132549 | 6/2008 | |
| JP | A-2008-132551 | 6/2008 | |
| JP | A-2008-145276 | 6/2008 | |
| JP | A-2008-260118 | 10/2008 | |
| JP | A-2009-142135 | 6/2009 | |
| WO | WO 2008/126685 A2 | 10/2008 | |
| WO | WO 2010/035431 A1 | 4/2010 | |
| WO | WO 2010143260 A1 * | 12/2010 | H01M 8/04 |

OTHER PUBLICATIONS

Office Action issued in Japanese Application No. 2012-521540 mailed Aug. 19, 2014 (with translation).
Sep. 20, 2011 International Preliminary Report on Patentability issued in International Patent Application No. PCT/JP2011/064458.
Sep. 20, 2011 International Search Report issued in International Patent Application No. PCT/JP2011/064458.
Jan. 13, 2015 Office Action issued in Japanese Patent Application No. 2012-521540.

* cited by examiner

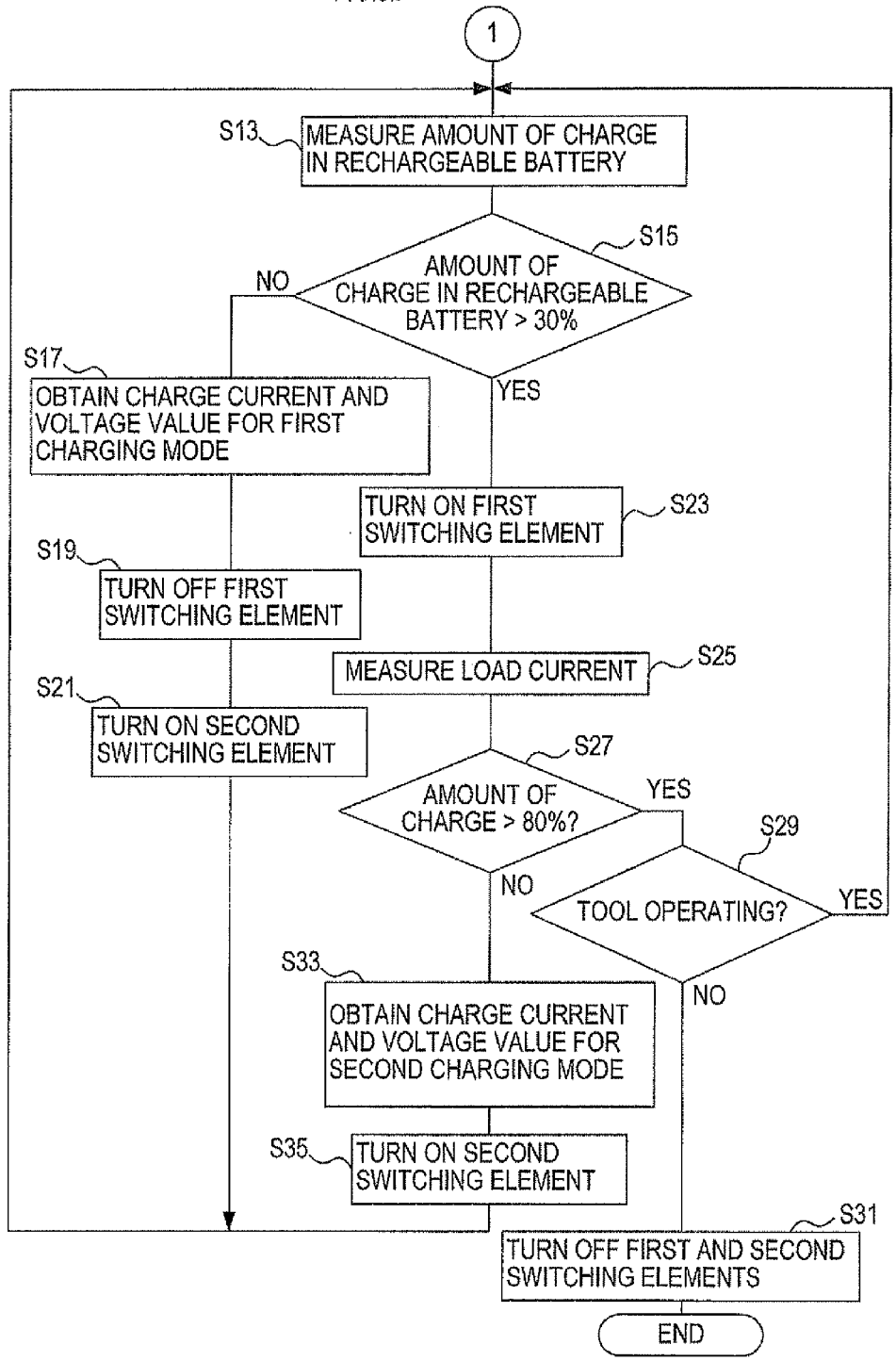

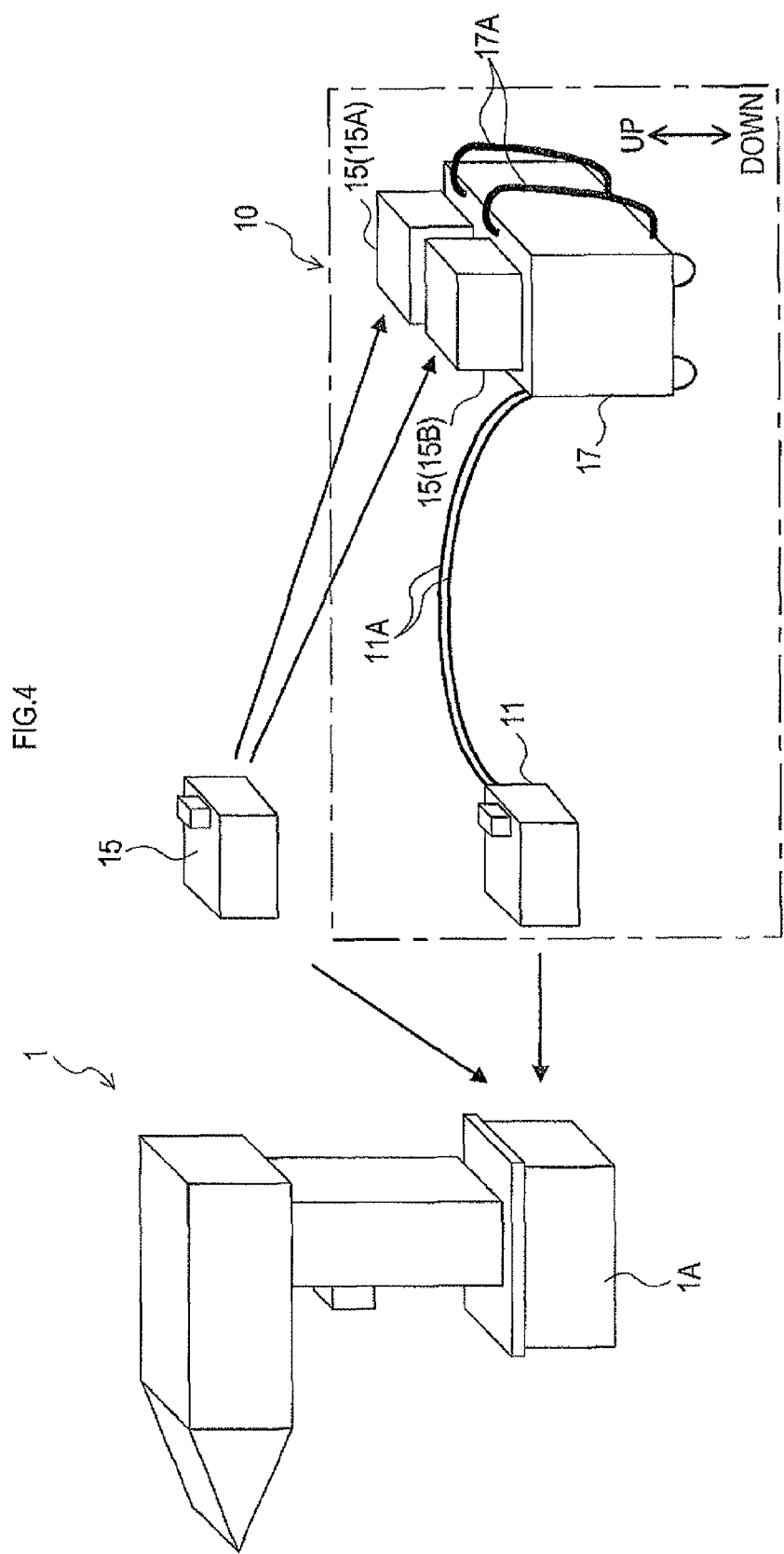

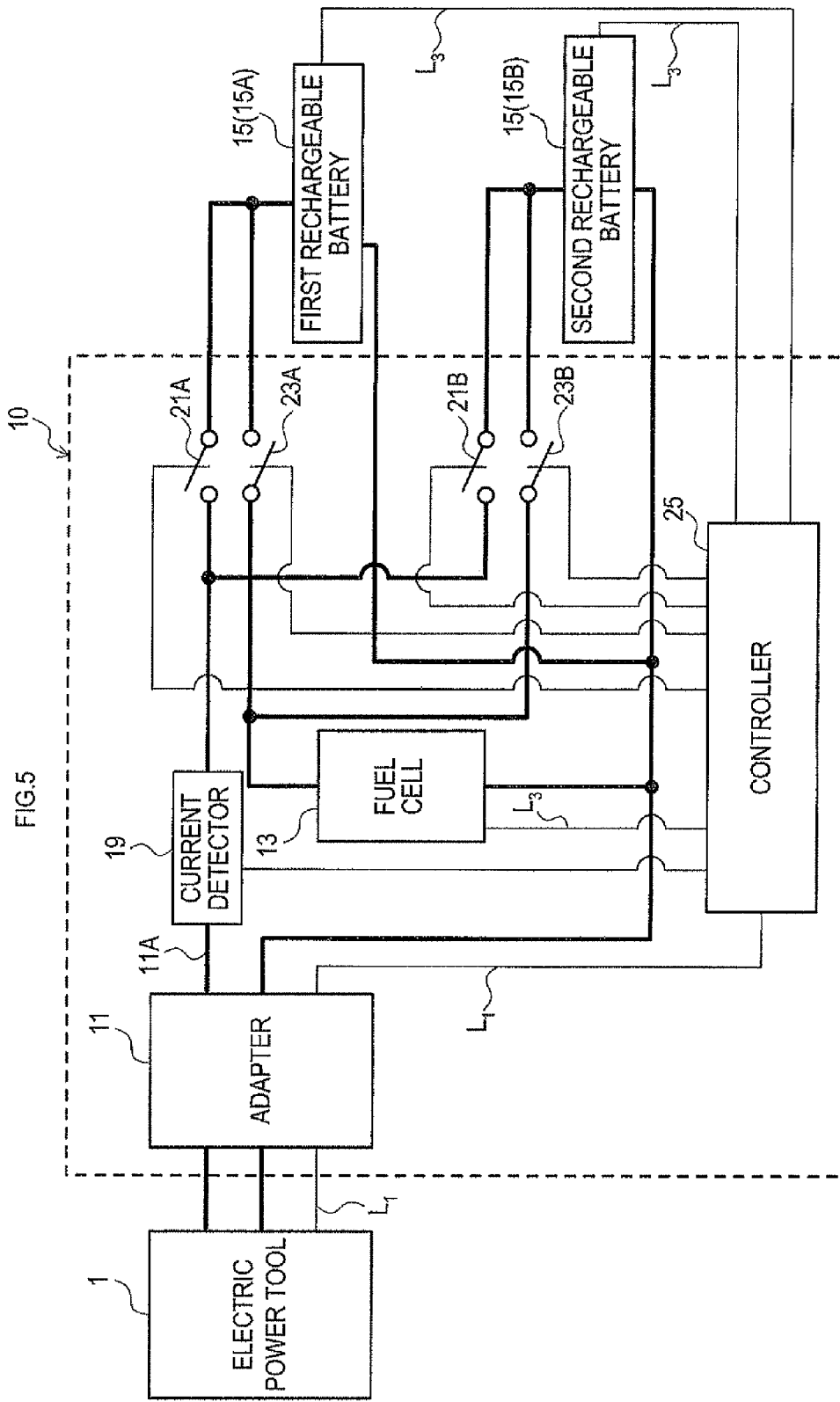

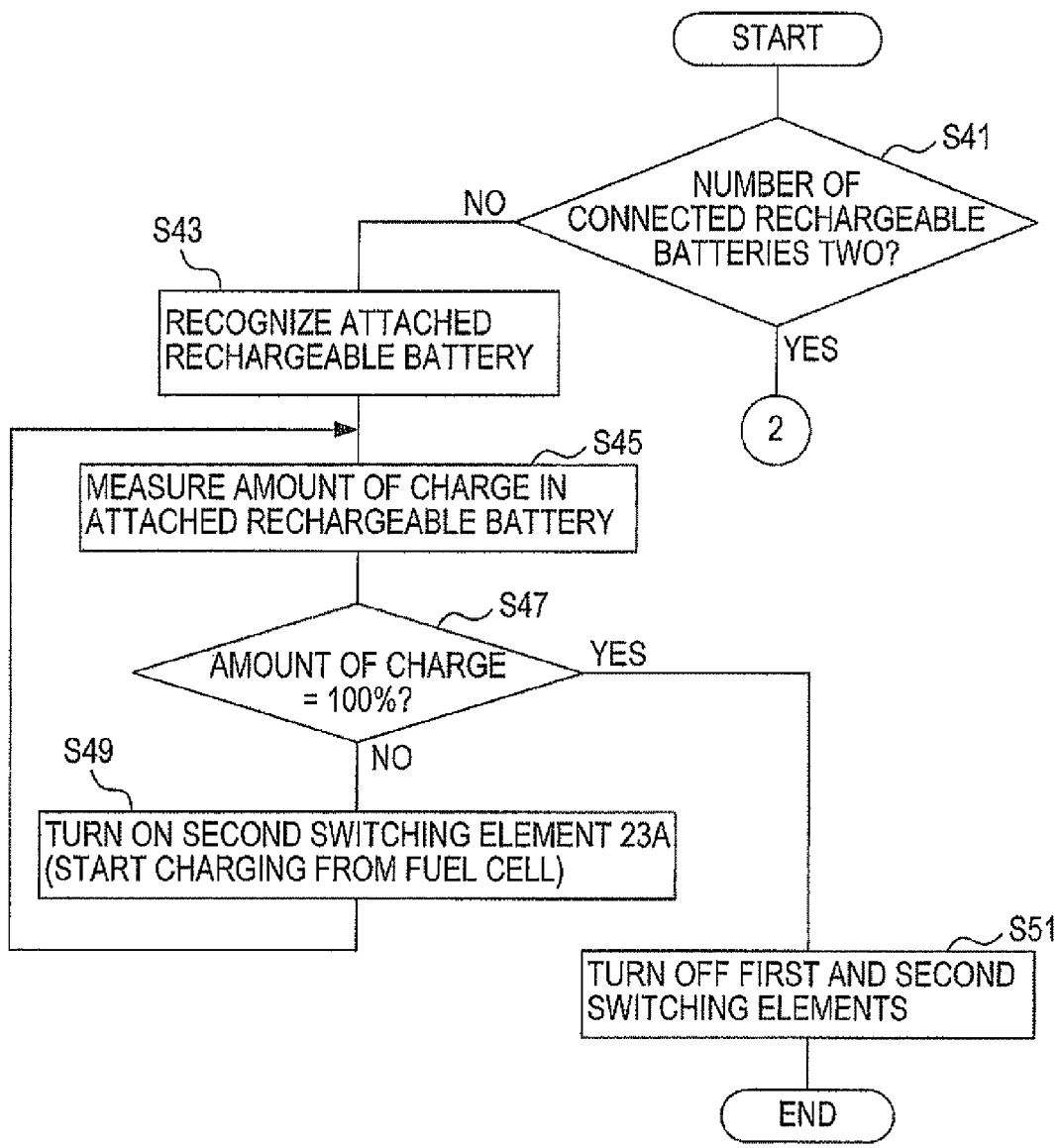

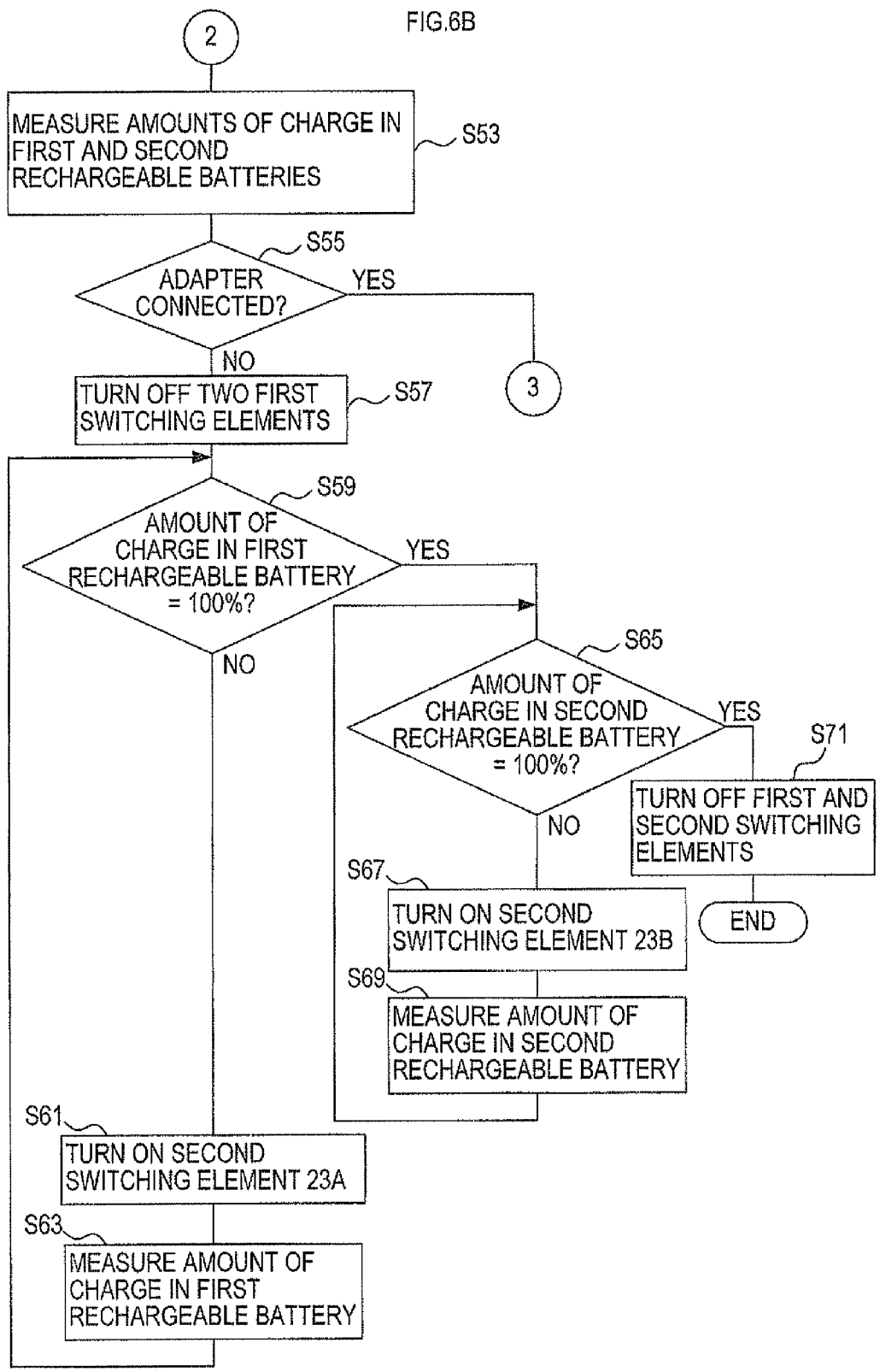

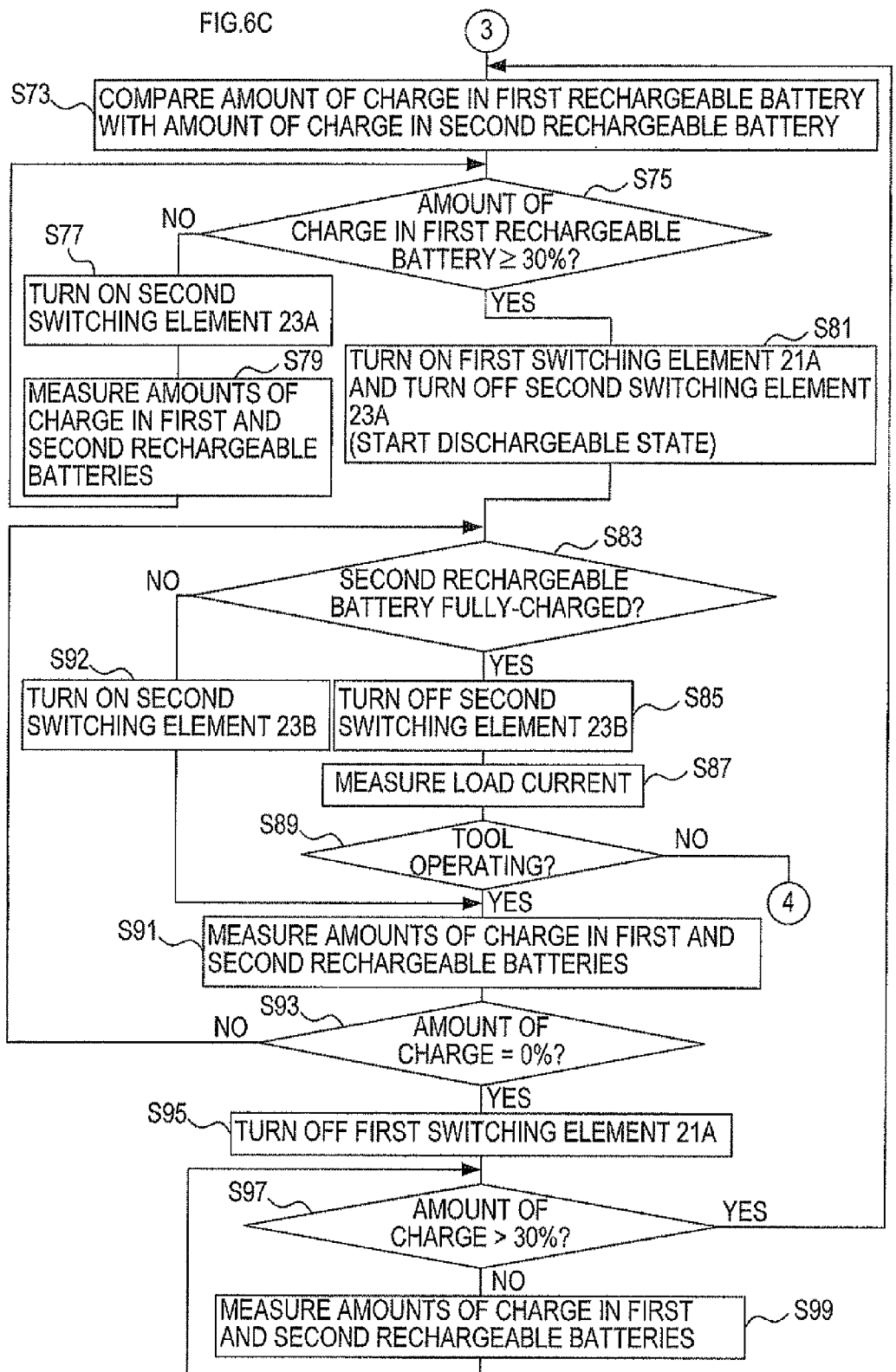

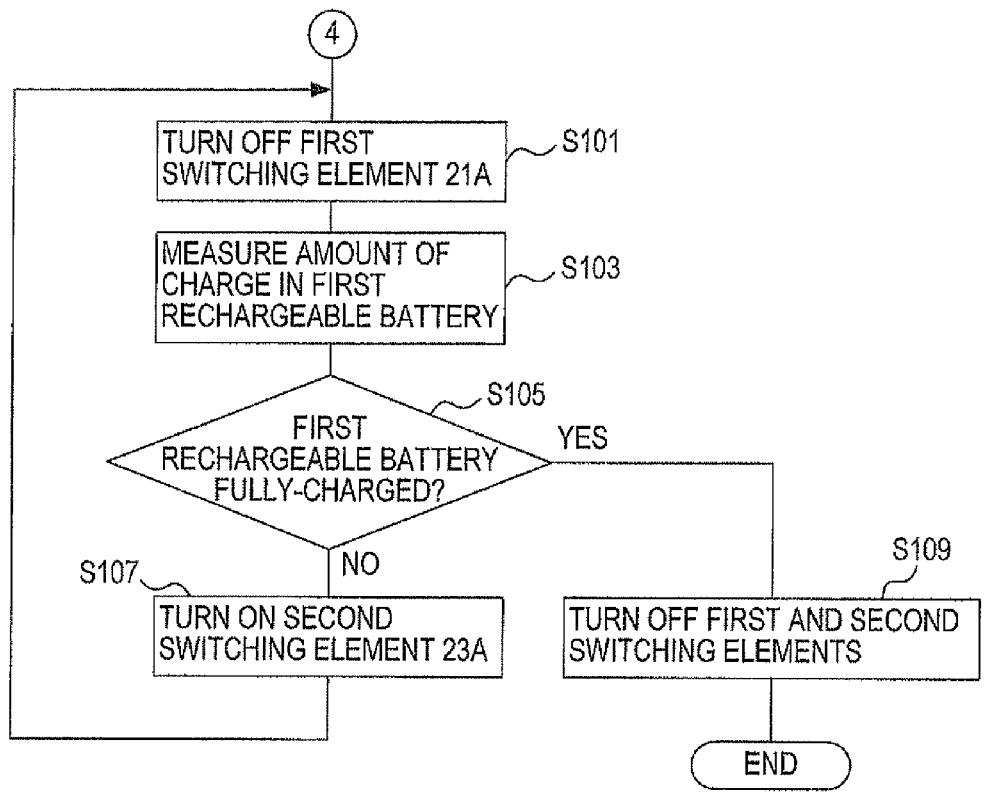

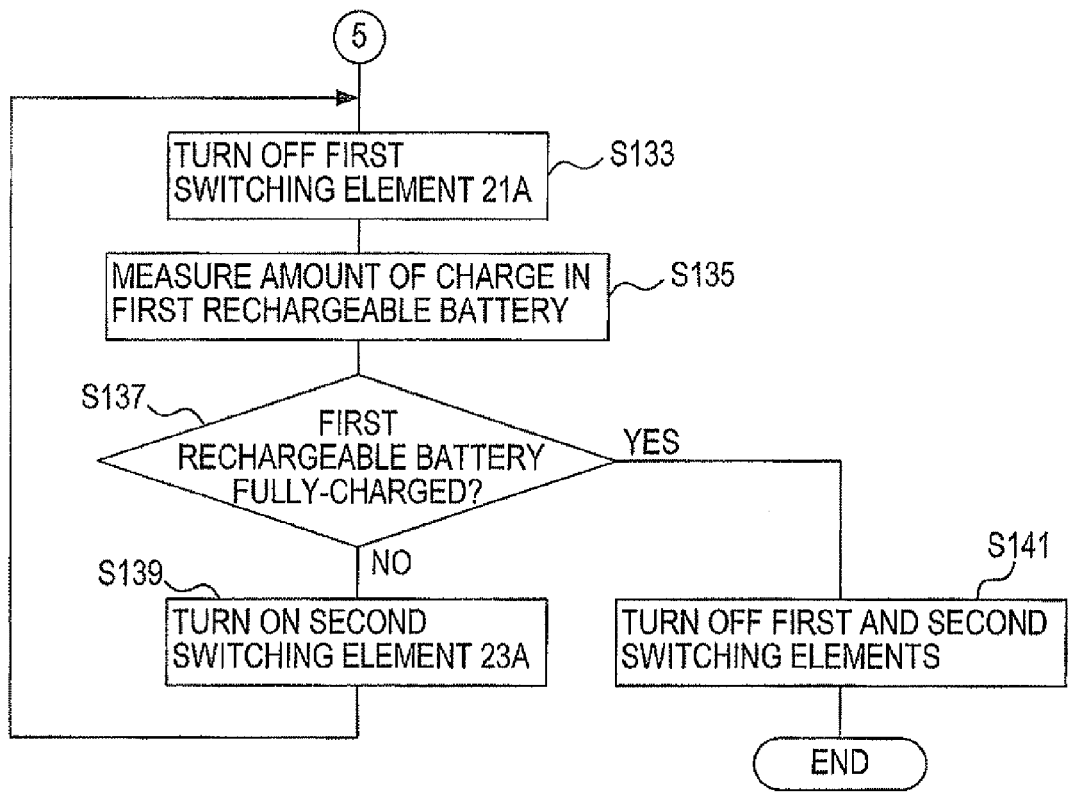

POWER SUPPLY DEVICE FOR ELECTRIC POWER TOOL

CROSS-REFERENCE TO RELATED APPLICATIONS

This international application claims the benefit of Japanese Patent Application No. 2010-142720 filed Jun. 23, 2010 in the Japan Patent Office, and the entire disclosure of Japanese Patent Application No. 2010-142720 is incorporated herein by reference.

TECHNICAL FIELD

The present invention relates to a power supply device for electric power tool that supplies an electric power to an electric power tool.

BACKGROUND ART

For example, a power supply device for electric power tool described in Patent Document 1 mentioned below is composed of an adapter to be electrically connected to an electric power tool, a rechargeable battery which supplies an electric power to the electric power tool, and so on.

In the invention described in Patent Document 1, in a case where an electric power stored in the rechargeable battery decreases and thus, the rechargeable battery reaches a deeply-discharged state, since an electric power sufficient to operate the electric power tool cannot be obtained from the rechargeable battery, it becomes necessary to charge the rechargeable battery.

PRIOR ART DOCUMENTS

Patent Documents

Patent Document 1: Unexamined Japanese Patent Application Publication No. 2001-145276

SUMMARY OF THE INVENTION

Problems to be Solved by the Invention

In order to lengthen an operable time of the electric power tool, a capacity of the rechargeable battery needs to be increased. However, as the capacity of the rechargeable battery increases, a time period required to charge the rechargeable battery in a deeply-discharged state until this rechargeable battery reaches a fully-charged state becomes loner.

In the invention described in Patent Document 1, the following problem arises: since it is not possible to operate the electric power tool during charging, an interruption time of work which the electric power tool is used becomes longer.

In view of the aforementioned problem, an object of the present invention is to shorten an interruption time of work in which an electric power tool is used by even one power supply device.

Means for Solving the Problems

The present invention to achieve the aforementioned object is a power supply device for electric power tool that supplies an electric power to an electric power tool; the power supply device is provided with an adapter configured to be electrically connected to the electric power tool, and a fuel cell configured to generate an electric power to be supplied to the electric power tool through the adapter, by causing an oxidation reaction between a fuel and an oxidant.

In the power supply device according to the present invention, the electric power to be supplied to the electric power tool is generated by the fuel cell. If a remaining amount of a fuel, etc. decreases, by replenishing the fuel, etc., the fuel cell can easily re-start generation of the electric power.

Moreover, a time period required to replenish the fuel, etc. is generally shorter than a time period required to charge the rechargeable battery in a deeply-discharged state until such a rechargeable battery reaches a fully-charged state. Thus, it is possible to shorten an interruption time of work in which an electric power tool is used by even one power supply device.

The power supply device in the present invention may include a charge unit configured to supply the electric power generated in the fuel cell to charge a rechargeable battery which is connected to the electric power tool to supply the electric power to the electric power tool.

Also, the power supply device in the present invention may be provided with at least one electricity storage unit; the at least one electricity storage unit includes an electricity storage function to store the electric power supplied from the fuel cell, and an electricity discharge function to supply the electric power to the electric power tool through the adapter.

Moreover, the at least one electricity storage unit may be charged by the charge unit.

Furthermore, in a case where the adapter is electrically connected to the electric power tool in a detachable manner from the electric power tool, the power supply device of the present invention may include a connection determination unit configured to determine whether or not the adapter is connected to the electric power tool. In this case, the charge unit may be provided with a plurality of charge operation modes including a first charging mode and a second charging mode; the first charging mode may be performed when the connection determination unit determines that the adapter is not connected to the electric power tool; and the second charging mode may be performed when the connection determination unit determines that the adapter is connected to the electric power tool.

The second charging mode may be a charge operation mode in which charging is performed at one of a voltage value lower than a voltage value in the first charging mode and a current value smaller than a current value in the first charging mode.

In a case where the at least one electricity storage unit is a plurality of electricity storage units, the power supply device in the present invention may include a selecting unit configured to select the electricity storage unit, which performs electric discharge by the electricity discharge function, and the electricity storage unit, which is to be charged by the electricity storage function, among the plurality of electricity storage units.

Moreover, the power supply device in the present invention may be provided with a lower-limit-reach determination unit configured to determine whether or not the electric power, which is stored in the electricity storage unit selected as a source of discharge by the selecting unit, has reached a pre-set lower limit. In this case, when the lower-limit-reach determination unit determines that the electric power stored in the electricity storage unit selected as the source of discharge has reached the lower limit, the selecting unit may set the electricity storage unit selected as the source of discharge, as an object to be charged.

Here, the lower limit may be set to have any value. For example, when the electricity storage unit is in a deeply-discharged state (i.e., a state where an electric power stored in the electricity storage unit is not sufficient to operate the electric power tool), a value of this electric power stored in the electricity storage unit may be set as the lower limit.

Moreover, the power supply device in the present invention may be provided with an upper-limit-reach determination unit configured to determine whether or not the electric power, which is stored in the electricity storage unit selected as an object to be charged by the selecting unit, has reached a pre-set upper limit. In this case, when the upper-limit-reach determination unit determines that the electric power stored in the electricity storage unit selected as the object to be charged has reached the upper limit, the selecting unit may set the electricity storage unit selected as the object to be charged, as a source of discharge.

Here, the upper limit may be set to have any value. For example, when the electricity storage unit is in a fully-charged state, a value of an electric power stored in the electricity storage unit may be set as the upper limit.

BRIEF DESCRIPTION OF THE DRAWINGS

FIG. 3B is a flowchart showing the rest of the charge control process of the power supply device according to the first embodiment, FIG. 4 is a conceptual diagram of a power supply device according to a second embodiment of the present invention.

FIG. 5 is a block diagram of the power supply device according to the second embodiment.

FIG. 6A is a flowchart showing a part of a charge control process of the power supply device according to the second embodiment.

FIG. 6B is a flowchart showing another part of the charge control process of the power supply device according to the second embodiment.

FIG. 6C is a flowchart showing yet another part of the charge control process of the power supply device according to the second embodiment.

FIG. 6D is a flowchart showing the rest of the charge control process of the power supply device according to the second embodiment.

FIG. 7B is a flowchart showing the rest of the charge control process of the power supply device according to the third embodiment.

EXPLANATION OF REFERENCE NUMERALS

1 . . . electric power tool, 1A . . . battery pack, 10 . . . power supply device, 11 . . . adapter, 11A . . . cable, 13 . . . fuel cell, 15 . . . rechargeable battery, 17 . . . power supply casing, 17A . . . shoulder belt, 19 . . . current detector, 21 . . . first switching element, 23 . . . second switching element, 25 . . . controller, 27 . . . power supply unit

MODE FOR CARRYING OUT THE INVENTION

Each of embodiments below is an example in which the present invention is applied to a power supply device for electric power tool that supplies an electric power to an electric power tool, such as an electric driver, an electric drill and the like, and will be described with reference to the drawings.

First Embodiment

1. Summary of a Power Supply Device for Electric Power Tool

Figure 1:
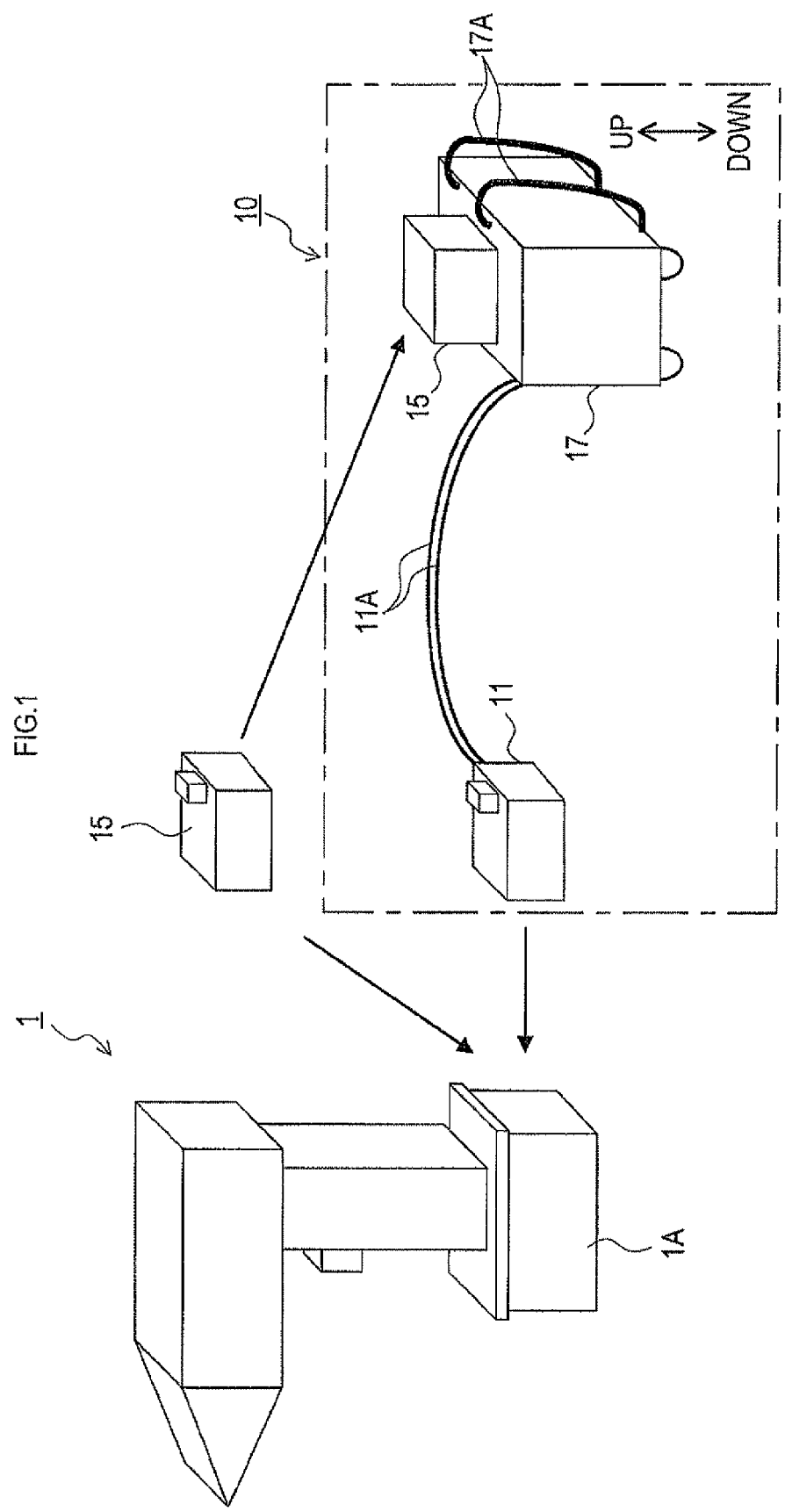
FIG. 1 is a conceptual diagram of a power supply device according to a first embodiment of the present invention.

As shown in FIG. 1, a power supply device 10 for electric power tool (hereinafter, simply referred to as "power supply device 10") according to the first embodiment includes an adapter 11, a fuel cell 13 (shown in FIG. 2), a rechargeable battery 15, and so on. The fuel cell 13 is accommodated in a power supply casing 17. The rechargeable battery 15 is detachably attached on an outer wall surface (in the first embodiment, an upper-surface-side outer wall surface) of the power supply casing 17.

On the power supply casing 17, a pair of shoulder belts 17A is provided and therefore, a user can use an electric power tool 1 while carrying the power supply device 10 on the user's shoulders.

The adapter 11 is electrically connected to the fuel cell 13, the rechargeable battery 15, and others via a pair of cables 11A. The adapter 11 is an intermediate device that is physically attached to the electric power tool 1 in a detachable manner so as to be electrically connected to the electric power tool 1. The fuel cell 13 generates an electric power by causing oxidation reaction between a fuel and an oxidant. The rechargeable battery 15 is a chargeable/dischargeable chemical battery, a capacitor, or the like.

As the fuel cell 13 according to the first embodiment, a direct methanol fuel cell (DMFC) is adopted; the DMFC does not supply a reformed fuel (hydrogen) to an electric power generation element in the fuel cell 13 but supplies, directly to the electric power generation element, a liquid fuel (methanol) stored in a not-shown fuel tank.

Moreover, in the first embodiment, at least an electrical connection portion (connection terminal), which is to be connected to the electric power tool 1, of the adapter 11 is configured to have the same arrangement and shape as an arrangement and shape of an electrical connection portion (connection terminal) of a battery pack 1A for electric power tool (hereinafter, simply referred to as battery pack 1A).

For this reason, the user can freely choose on one's own whether to operate the electric power tool 1 by receiving a supply of electric power from the power supply device 10 through the adapter 11 or to operate the electric power tool 1 by receiving a supply of electric power from the battery pack 1A.

The battery pack 1A is a power source to be directly attached to the electric power tool 1 and is composed of a non-rechargeable battery or a rechargeable battery. In the first embodiment, the battery pack 1A is composed of a chargeable/dischargeable chemical battery, a capacitor, or the like.

In the first embodiment, a rechargeable battery which is the same as or compatible with a rechargeable battery as the battery pack 1A is used as the rechargeable battery 15. Thus, an electrical connection portion (connection terminal) to the rechargeable battery 15, which is provided on the power supply casing 17, is configured to have an arrangement and shape such that the battery pack 1A can be attached.

2. Electrical Configuration of the Power Supply Device

Figure 2:
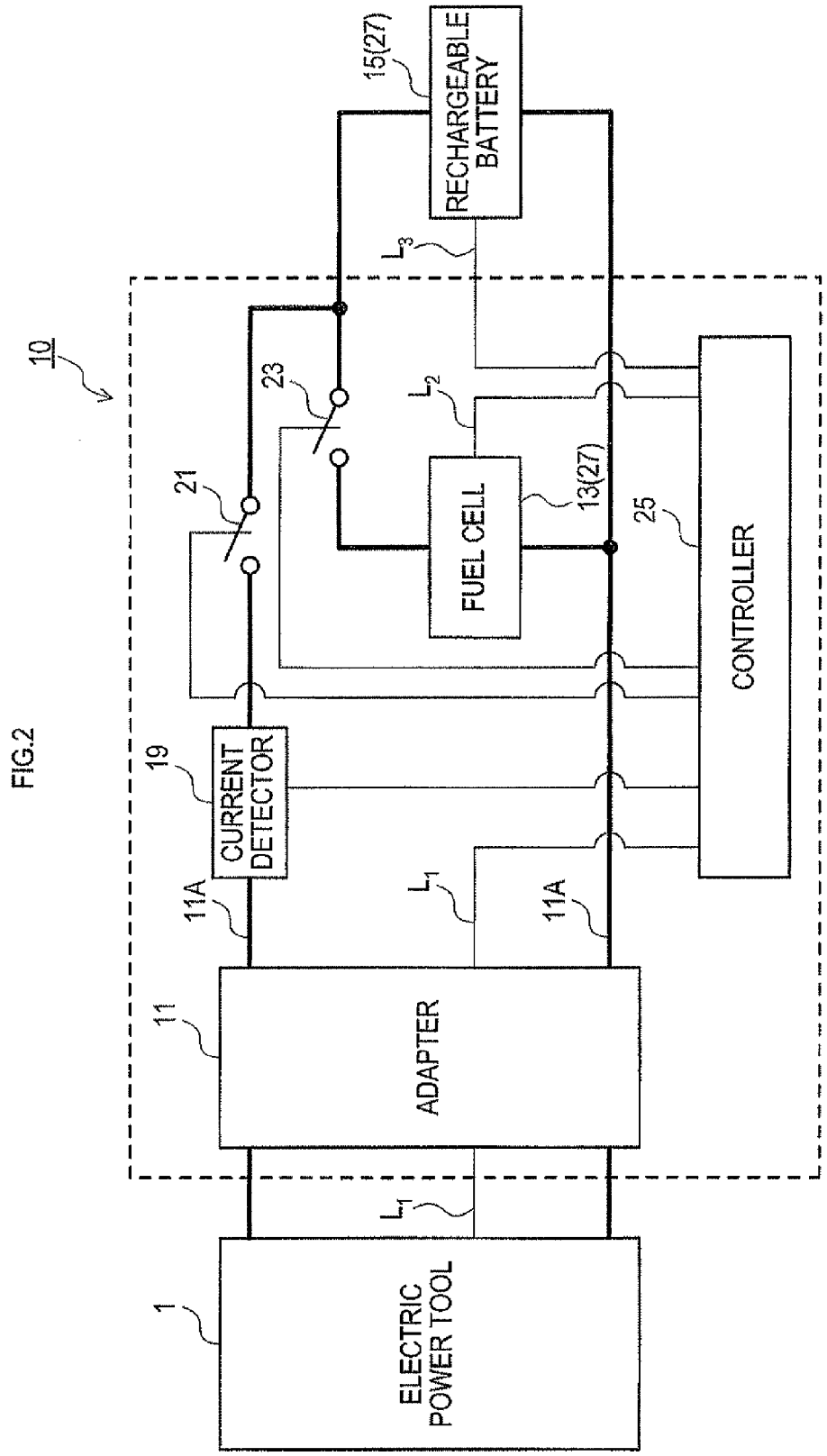
FIG. 2 is a block diagram of the power supply device according to the first embodiment.

As shown in FIG. 2, the power supply casing 17 accommodates thereinside the fuel cell 13, a current detector 19, a first switching element 21, a second switching element 23, a controller 25, and so on.

The fuel cell 13 and the rechargeable battery 15 are connected to the adapter 11 (the electric power tool 1) in a state where the fuel cell 13 and the rechargeable battery 15 are connected in parallel to each other. Therefore, an electric power (electric current) is supplied to the adapter 11 (the electric power tool 1) from at least one of the fuel cell 13 and the rechargeable battery 15. Hereinafter, when collectively referred to, the fuel cell 13 and the rechargeable battery 15 are referred to as a power supply unit 27.

The first switching element 21 makes and/or breaks a current path which is from the power supply unit 27 to the adapter 11. The second switching element 23 makes and/or breaks a path of an electric current outputted from the fuel cell 13. More specifically, when the second switching element 23 is turned on, an electric current flows from the fuel cell 13 to supply the electric power of the fuel cell 13. On the other hand, when the second switching element 23 is turned off, the supply of the electric power from the fuel cell 13 is suspended.

Such operations of the first switching element 21 and the second switching element 23 are controlled by the controller 25. The controller 25 is constituted by a microcomputer including a computing unit, a memory, etc. The controller 25 operates by receiving a supply of electric power from the rechargeable battery 15. The current detector 19 detects a value of an electric current to be supplied to the adapter 11 (the electric power tool 1) from the power supply unit 27. A detection signal outputted from the current detector 19 is inputted to the controller 25.

Connected to the controller 25 are a signal line L1, a signal line L2, and a signal line L3. Through the signal line L1, a signal indicating whether or not the adapter 11 is connected to the electric power tool 1 is transmitted. Through the signal line L2, a signal indicating whether or not the fuel cell 13 is connected, and a signal indicating a remaining amount of a fuel for the fuel cell 13 or indicating an output voltage value of the fuel cell 13 are transmitted. Through the signal line L3, a signal indicating an output voltage value of the rechargeable battery 15 and a signal indicating an output current value of the rechargeable battery 15 are transmitted.

3. Operation of the Power Supply Device

Figure 3A:
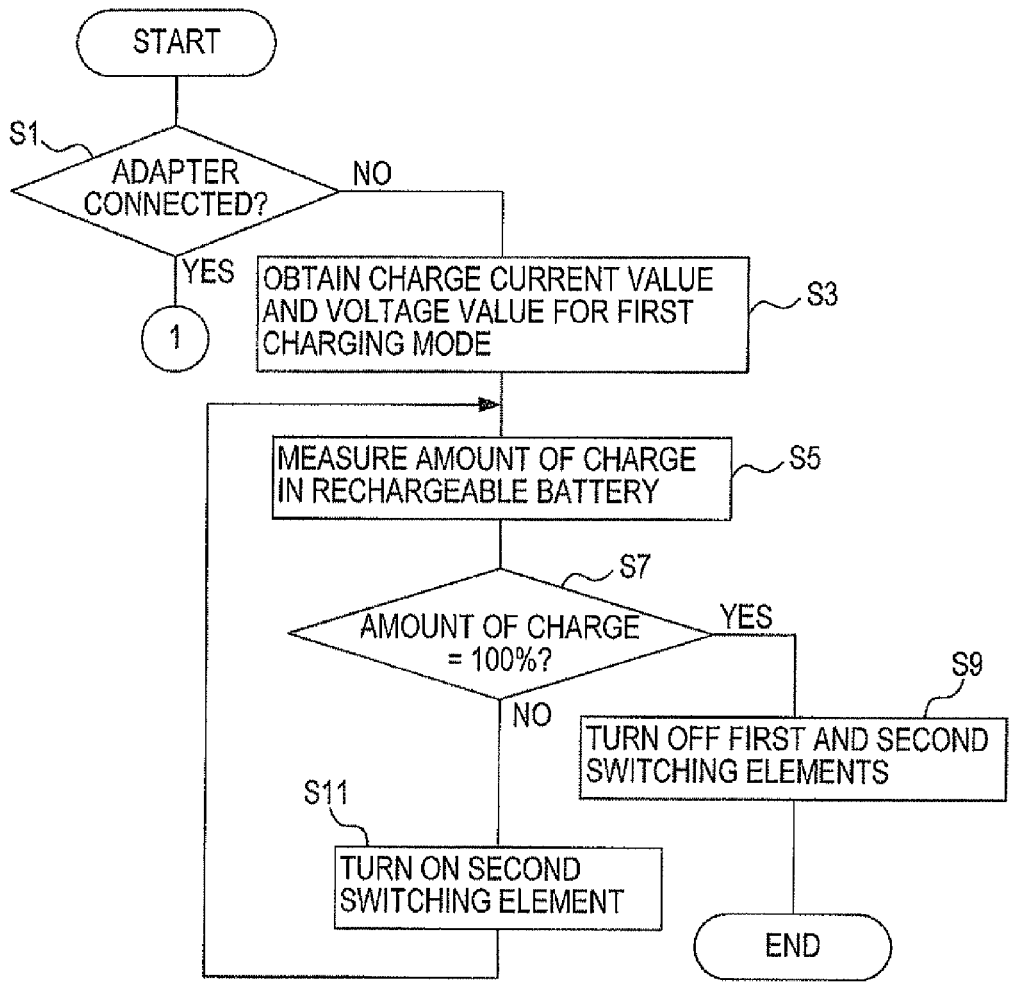
FIG. 3A is a flowchart showing a part of a charge control process of the power supply device according to the first embodiment.

The controller 25 executes a charge control process shown in a flowchart of FIGS. 3A and 3B, in accordance with a program stored in the memory, which is not shown, such as a ROM, etc. included in the controller 25; consequently, the controller 25 controls turning on/off of the first switching element 21 and the second switching element 23, to thereby control the charge to the rechargeable battery 15, and so on. In the memory of the controller 25, the program to execute the aforementioned charge control process, and a charge current value and a charge voltage value for charging the rechargeable battery 15, are stored.

The charge control process is executed if any of following timings (a) to (c) arrives.
(a) a timing at which the rechargeable battery 15 is attached to the power supply device 10
(b) a timing at which the adapter 11 is attached to or detached from the electric power tool 1
(c) a timing at which the electric power tool 1 starts operating, after a predetermined time of a continued state in which the electric power tool 1 with the adapter 11 being connected thereto has not been operated Since the controller 25 operates by receiving the supply of electric power from the rechargeable battery 15, the charge control process is not executed when the rechargeable battery 15 is not attached to the power supply device 10. When the rechargeable battery 15 is attached to the power supply device 10, an electric power is supplied to the controller 25 to thereby execute the charge control process. Thereafter, the charge control process is terminated, and then, the charge control process is executed again when the aforementioned timing (b) or timing (c) arrives.

In a case where the fuel cell 13 is not connected, and in a case where the remaining amount of the fuel for the fuel cell 13 or an output voltage of the fuel cell 13 is less than or equal to a corresponding predetermined value, an alert (in the first embodiment, lighting of an alerting lamp) indicating occurrence of these cases is given.

Then, when the charge control process is started, it is firstly determined whether or not the adapter 11 is connected to the electric power tool 1 (S1). If it is determined that the adapter 11 is not connected to the electric power tool 1 (S1: NO), a charge current value and a charge voltage value for a first charging mode are obtained from the ROM (S3), so as to charge the rechargeable battery 15 in the first charging mode.

Next, an amount of electric power, i.e., an amount of charge, stored in the rechargeable battery 15 is measured (S5), and then, it is determined whether or not the rechargeable battery 15 is in a fully-charged state (S7). In the first embodiment, the measurement of the amount of charge and the determination of whether or not the rechargeable battery 15 is in the fully-charged state are performed based on the output voltage value of the rechargeable battery 15. That is to say, if the output voltage value of the rechargeable battery 15 is greater than or equal to a voltage value indicating the fully-charged state, it is determined that the rechargeable battery 15 is in the fully-charged state.

Then, if it is determined that the rechargeable battery 15 is in the fully-charged state (S7: YES), the first switching element 21 and the second switching element 23 are turned off (S9); thereafter, the present charge control process is terminated.

On the other hand, if it is determined that the rechargeable battery 15 is not in the fully-charged state (S7: NO), the second switching element 23 is turned on (S11); thereafter, S5 is executed again. In other words, the rechargeable battery 15 is charged until the rechargeable battery 15 reaches the fully-charged state by receiving a supply of an electric power from the fuel cell 13. In this case, the rechargeable battery 15 is charged with the charge current value and the charge voltage value for the first charging mode, both of which are obtained from the ROM in S3.

In the first embodiment, the second switching element 23 is periodically turned on/off such that the charge current value and the charge voltage value, respectively, become the charge current value and the charge voltage value for the first charging mode. That is to say, in S11, the second switching element 23 is turned on for a predetermined period of time, so that an electric power is outputted from the fuel cell 13 for the predetermined period of time. Here, the second switching element 23 may be continuously turned on by separately providing another controller for adjusting the charge current value and the charge voltage value.

However, if it is determined in S1 that the adapter 11 is connected to the electric power tool 1 (S1: YES), an amount of charge stored in the rechargeable battery 15 is measured (S13), and then, it is determined whether or not the amount of charge exceeds 30% of that in the fully-charged state (S15). If it is determined that the amount of charge is less than or equal to 30% of that in the fully-charged state (S15: NO), the charge current value and the charge voltage value for the first charging mode are obtained from the ROM (S17).

Next, after the first switching element 21 is turned off (S19) and then the second switching element 23 is turned on (S21), S13 is executed again. In other words, the rechargeable battery 15 is charged with the charge current value and the charge voltage value for the first charging mode, which are obtained from the ROM in S17, until the amount of charge exceeds 30% of that in the fully-charged state by receiving a supply of an electric power from the fuel cell 13.

Here, specific control methods for the charge current value and the charge voltage value are the same as a method in a case where it is determined that the adapter 11 is not connected to the electric power tool 1.

On the other hand, if it is determined in S15 that the amount of charge exceeds 30% of that in the fully-charged state (S15: YES), the first switching element 21 is turned on (S23) to bring the power supply device 10 in a state where the power supply device 10 can supply an electric power to the electric power tool 1. Thereafter, based on a detected value by the current detector 19, an electric power which is supplied to the electric power tool 1, i.e., a load current, is measured (S25).

Next, it is determined whether or not the amount of charge in the rechargeable battery 15 exceeds 80% of that in the fully-charged state (S27). If it is determined that the amount of charge exceeds 80% of that in the fully-charged state (S27: YES), whether or not the electric power tool 1 is operating is determined based on a value of the load current measured in S25 (S29).

Then, if it is determined that the electric power tool is operating (S29: YES), S13 is executed again. However, if it is determined that the electric power tool 1 is not operating (S29: NO), the first switching element 21 and the second switching element 23 are turned off (S31), and thereafter, the present charge control process is terminated.

On the other hand, if it is determined in S27 that the amount of charge in the rechargeable battery 15 is less than or equal to 80% of that in the fully-charged state (S27: NO), a charge current value and a charge voltage value for a second charging mode are obtained from the ROM (S33), so as to charge the rechargeable battery 15 in the second charging mode.

Next, after the second switching element 23 is turned on (S35), S13 is executed again. In other words, the rechargeable battery 15 is charged with the charge current value and the charge voltage value for the second charging mode, which are obtained from the ROM in S33, until the amount of charge in the rechargeable battery 15 exceeds 80% of that in the fully-charged state by receiving a supply of an electric power from the fuel cell 13.

Specific control methods for the charge current value and the charge voltage value are the same as a method in a case where it is determined that the adapter 11 is not connected to the electric power tool 1.

Here, absolute values of the charge current value and the charge voltage value for the second charging mode are set to be values lower (smaller) than corresponding absolute values of the charge current value and the charge voltage value for the first charging mode. In the first embodiment, a lithium-ion battery is used as the rechargeable battery 15. Accordingly, the charge current value for the first charging mode per one cell is about 2 C (C stands for a unit representing a charge rate); the charge voltage value for the first charging mode is about 4.2 V; the charge current value for the second charging mode is about 1 C (C stands for the unit representing the charge rate); and the charge voltage value for the second charging mode is about 4.0 V.

4. Features of the Power Supply Device According to the First Embodiment

In the first embodiment, the electric power to be supplied to the electric power tool 1 is generated by the fuel cell 13. In a case where a remaining amount of a fuel and the like decreases, the fuel cell 13 can easily resume generation of electricity by being supplied with the fuel and the like.

A time period required to supply the fuel and the like is generally shorter than a time period required to charge a rechargeable battery in a deeply-discharged state until the rechargeable battery reaches a fully-charged state. Therefore, it is possible to reduce an interruption time of work in which the electric power tool 1 is used by even one power supply device 1. In other words, it is possible to lengthen a substantially operable time of the electric power tool 1 by even one power supply device 10.

Since the fuel tank of the fuel cell 13 in the first embodiment is a detachable cartridge-type tank, the fuel can be easily supplied to the fuel cell 13 by replacing the fuel tank.

Moreover, in the first embodiment, since the electric power generated in the fuel cell 13 can be charged to the battery pack 1A, the power supply device 10 can be also used as a charger for the battery pack 1A.

In the first embodiment, there is provided the rechargeable battery 15 which has an electricity storage function for storing the electric power supplied from the fuel cell 13 and an electricity discharge function for supplying the electric power to the electric power tool 1 through the adapter 11. Thus, the electric power can be stably supplied to the electric power tool 1 for a long period of time.

Furthermore, in the first embodiment, the connection terminal of the battery pack 1A and the connection terminal of the rechargeable battery 15 have the same arrangement and shape, thereby maintaining compatibility. Consequently, both of the battery pack 1A and the rechargeable battery 15 can be charged with electricity, and the battery pack 1A can be used as the rechargeable battery 15.

In the first embodiment, the first charging mode is performed when it is determined that the adapter 11 is not connected to the electric power tool, while the second charging mode is performed when it is determined that the adapter 11 is connected to the electric power tool. Therefore, the rechargeable battery 15 can be charged without deteriorating a battery life thereof.

That is, when charging is performed to the rechargeable battery 15 while the electric power tool 1 is operating, a load is applied to the rechargeable battery 15 for a long period of time, thereby causing an increase in the load to the rechargeable battery 15. Consequently, the battery life of the rechargeable battery 15 may be deteriorated. However, in the first embodiment, in a case where it is determined that the adapter 11 is connected to the electric power tool 1 in which the electric power tool 1 is in an operable state, charging is performed with a lower voltage value or a smaller current value than that in a case where it is determined that the adapter 11 is not connected to the electric power tool 1 in which the electric power tool 1 is not in an operable state. As a result, it is possible to suppress an increase in the load to the rechargeable battery 15 and therefore, to suppress deterioration of the battery life of the rechargeable battery 15.

5. Corresponding Relationship Between Matters Specifying the Invention and the First Embodiment In the first embodiment, the rechargeable battery 15 is an example of an electricity storage unit in the present invention, the battery pack 1A is an example of a rechargeable battery in the present invention, and the controller 25 is an example of a connection determination unit and an example of a charge unit.

Second Embodiment

A power supply device 10 according to the second embodiment is configured such that, as shown in FIG. 4, a plurality of rechargeable batteries 15 can be attached and that, as shown in FIG. 5, the first switching element 21 and the second switching element 23 are provided in each of the rechargeable batteries 15.

Although the second embodiment is configured such that the plurality of rechargeable batteries 15 can be attached, hereinafter, explanations of the second embodiment will be given with respect to an example in which two rechargeable batteries 15 are attached, for the purpose of simplifying the explanation.

Here, the rechargeable batteries 15 are to be attached to a plurality of attachment portions (in the second embodiment, two attachment portions). The rechargeable battery 15 attached to a first attachment portion is referred to as a first rechargeable battery 15A, and the rechargeable battery 15 attached to a second attachment portion is referred to as a second rechargeable battery 15B. When collectively referred to, the first rechargeable battery 15A and the second rechargeable battery 15B are described as the rechargeable battery 15.

The first switching element 21 and the second switching element 23 for the first rechargeable battery 15A are, respectively, described as a first switching element 21A and a second switching element 23A. The first switching element 21 and the second switching element 23 for the second rechargeable battery 15B are, respectively, described as a first switching element 21B and a second switching element 23B. When collectively referred to, the first switching elements 21A and 21B are described as the first switching elements 21. When collectively referred to, the second switching elements 23A and 23B are described as the second switching elements 23.

1. Operation of the Power Supply Device

FIGS. 6A, 6B, 6C, and 6D are flowcharts showing a charge control process in the power supply device 10 according to the second embodiment. This charge control process is executed at timings which are the same as the timings in the first embodiment. The controller 25 operates by receiving a supply of electric power from at least one of the first rechargeable battery 15A and the second rechargeable battery 15B. Therefore, if any of the rechargeable batteries 15 are not attached to the power supply device 10, the charge control process will not be executed.

When the charge control process is executed, as shown in FIGS. 6A to 6D, it is firstly determined whether or not a number of the rechargeable batteries 15 attached to the power supply device 10 is two (S41). If it is determined that the number of the attached rechargeable batteries 15 is not two, i.e., one (S41: NO), it is recognized which of the attachment portions the rechargeable battery 15 is attached to (S43). Hereinafter, explanations will be given on the assumption that it is recognized in S43 that the rechargeable battery 15 is attached to the first attachment portion.

Next, an amount of charge in the first rechargeable battery 15A is measured (S45), and thereafter, it is determined whether or not the first rechargeable battery 15A is in a fully-charged state (S47). If it is determined that the first rechargeable battery 15A is not in the fully-charged state (S47: NO), the second switching element 23A for the first rechargeable battery 15A is turned on (S49); thereafter, S45 is executed again.

However, if it is determined that the first rechargeable battery 15A is in the fully-charged state (S47: YES), the first switching element 21 and the second switching element 23 are turned off (S51); thereafter, the present charge control process is terminated. In other words, the first rechargeable battery 15A is charged until the first rechargeable battery 15A reaches the fully-charged state. When the first rechargeable battery 15A reaches the fully-charged state, such a charge control is terminated. In the second embodiment, the charging to the rechargeable battery 15 is performed in the above-described first charging mode.

On the other hand, if it is determined in S41 that the number of the attached rechargeable batteries 15 is two (S41: YES), an amount of charge in the first rechargeable battery 15A and an amount of charge in the second rechargeable battery 15B are measured (S53). Thereafter, it is determined whether or not the adapter 11 is connected to the electric power tool 1 (S55).

If it is determined that the adapter 11 is not connected to the electric power tool 1 (S55: NO), the first switching elements 21 (21A, 21B) are turned off (S57). Thereafter, it is determined whether or not the first rechargeable battery 15A is in the fully-charged state (S59).

In this case, if it is determined that the first rechargeable battery 15A is not in the fully-charged state (S59: NO), the second switching element 23A for the first rechargeable battery 15A is turned on (S61). After the amount of charge in the first rechargeable battery 15A is measured (S63), S59 is executed again. Consequently, the first rechargeable battery 15A is charged until the first rechargeable battery 15A reaches the fully-charged state.

Then, if it is determined that the first rechargeable battery 15A is in the fully-charged state (S59: YES), it is determined whether or not the second rechargeable battery 15B is in the fully-charged state (S65). If it is determined that the second rechargeable battery 15B is not in the fully-charged state (S65: NO), the second switching element 23B for the second rechargeable battery 15B is turned on (S67).

Next, after the amount of charge in the second rechargeable battery 15B is measured (S69), S65 is executed again. Thereby, the second rechargeable battery 15B is charged until the second rechargeable battery 15B reaches the fully-charged state. If it is determined that the second rechargeable battery 15B is in the fully-charged state (S65: YES), the first switching element 21 and the second switching element 23 are turned off (S71). Thereafter, the present charge control process is terminated.

On the other hand, if it is determined in S55 that the adapter 11 is connected to the electric power tool 1 (S55: YES), the amount of charge in the first rechargeable battery 15A and the amount of charge in the second rechargeable battery 15B are compared with each other, and one of the rechargeable batteries which has a larger amount of charge is selected (S73). Hereinafter, explanations will be given on the assumption that the first rechargeable battery 15A is selected, in S73, as the rechargeable battery having the larger amount of charge.

Next, it is determined whether or not the amount of charge in the first rechargeable battery 15A is greater than or equal to 30% of that in the fully-charged state (S75). If it is determined that the amount of charge is less than 30% of that in the fully-charged state (S75: NO), the second switching element 23A for the first rechargeable battery 15A is turned on (S77).

Then, the amount of charge in the first rechargeable battery 15A and the amount of charge in the second rechargeable battery 15B are measured (S79); thereafter, S75 is executed again. In other words, charging to the first rechargeable battery 15A is performed until the amount of charge in the first rechargeable battery 15A becomes greater than or equal to 30% of that in the fully-charged state.

However, if it is determined that the amount of charge in the first rechargeable battery 15A is greater than or equal to 30% of that in the fully-charged state (S75: YES), the second switching element 23A for the first rechargeable battery 15A is turned off and also, the first switching element 21A for the first rechargeable battery 15A is turned on (S81), thereby making it possible to supply an electric power to the electric power tool 1 from the first rechargeable battery 15A.

Next, it is determined whether or not the second rechargeable battery 15B is in the fully-charged state (S83). If it is determined that the second rechargeable battery 15B is not in the fully-charged state (S83: NO), the second switching element 23B for the second rechargeable battery 15B is turned on so as to start charging to the second rechargeable battery 15B (S92). Thereafter, the amount of charge in the first rechargeable battery 15A and the amount of charge in the second rechargeable battery 15B are measured (S91).

On the other hand, if it is determined that the second rechargeable battery 15B is in the fully-charged state (S83: YES), the second switching element 23B for the second rechargeable battery 15B is turned off to suspend the charging to the second rechargeable battery 15B (S85). Thereafter, based on a detected value by the current detector 19, an electric power which is supplied to the electric power tool 1, i.e., a load current, is measured (S87).

Next, whether or not the electric power tool 1 is operating is determined based on a value of the load current measured in S87 (S89). If it is determined that the electric power tool 1 is operating (S89: YES), the amount of charge in the first rechargeable battery 15A and the amount of charge in the second rechargeable battery 15B are measured (S91). Thereafter, it is determined whether or not the amount of charge in the first rechargeable battery 15A is decreased to a degree that can be considered to be 0% of the amount of charge in the fully-charged state (S93).

If it is determined that the amount of charge in the first rechargeable battery 15A is not decreased to the degree that can be considered to be 0% of the amount of charge in the fully-charged state (S93: NO), S83 is executed again. On the other hand, if it is determined that the amount of charge in the first rechargeable battery 15A is decreased to the degree that can be considered to be 0% of the amount of charge in the fully-charged state (S93: YES), the first switching element 21A for the first rechargeable battery 15A is turned off (S95), thereby suspending the supply of the electric power to the electric power tool 1 from the first rechargeable battery 15A.

Next, it is determined whether or not the amount of charge in the second rechargeable battery 15B exceeds 30% of that in the fully-charged state (S97). If it is determined that the amount of charge in the second rechargeable battery 15B is less than or equal to 30% of that in the fully-charged state (S97: NO), the amount of charge in the first rechargeable battery 15A and the amount of charge in the second rechargeable battery 15B are measured (S99). Thereafter, S97 is executed again.

On the other hand, if it is determined that the amount of charge in the second rechargeable battery 15B exceeds 30% of that in the fully-charged state (S97: YES), S73 is executed again. In this case, since the amount of charge in the first rechargeable battery 15A is smaller than the amount of charge in the second rechargeable battery 15B, the second rechargeable battery 15B is selected (S73).

That is to say, when the rechargeable battery 15 which has been selected as a source of discharge reaches a deeply-discharged state, this rechargeable battery 15 selected as the source of discharge is selected to be the rechargeable battery 15 as an object to be charged, and the rechargeable battery 15 which has been selected as the object to be charged is selected to be the rechargeable battery 15 as the source of discharge.

On the other hand, if it is determined in S89 that the electric power tool 1 is not operating (S89: NO), the first switching element 21 for the rechargeable battery 15 which has been selected in S73 as the source of discharge (in this case, the first switching element 21A for the first rechargeable battery 15A) is turned off (S101). Thereafter, the amount of charge in the rechargeable battery 15 selected as the source of discharge (hereinafter, described as the first rechargeable battery 15A) is measured (S103).

Then, it is determined whether or not the first rechargeable battery 15A is in the fully-charged state (S105). If it is determined that the first rechargeable battery 15A is not in the fully-charged state (S105: NO), the second switching element 23A for the first rechargeable battery 15A is turned on so as to start charging to the first rechargeable battery 15A (S107). Thereafter, S101 is executed again.

Thereafter, if it is determined that the first rechargeable battery 15A is in the fully-charged state (S105: YES), the first switching element 21 and the second switching element 23 are turned off (S109), and then, the present charge control process is terminated.

2. Features of the Power Supply Device According to the Second Embodiment

In the second embodiment, the plurality of the rechargeable batteries 15 can be attached. Thus, an operation time of the electric power tool 1 can be made longer.

Moreover, in the second embodiment, the rechargeable battery which is caused to discharge by the electricity discharge function and the rechargeable battery which is caused to be charged by the electricity storage function are selected from the plurality of the rechargeable batteries 15. Therefore, it is possible to reduce the load to the rechargeable battery 15, and lengthen the operation time of the electric power tool 1 while suppressing reduction of the battery life of the rechargeable battery 15.

In the second embodiment, whether the rechargeable battery 15 reaches the deeply-discharged state or the fully-charged state is determined, and when the rechargeable battery 15 selected as the source of discharge reaches the deeply-discharged state, this rechargeable battery 15 selected as the source of discharge is set as the object to be charged. For this reason, the rechargeable battery 15 can be efficiently charged and discharged while suppressing reduction of the battery life of the rechargeable battery 15.

3. Corresponding Relationship Between Matters Specifying the Invention and the Second Embodiment In the second embodiment, the controller 25 is an example of a selecting unit and an example of a lower-limit-reach determination unit in the present invention.

Third Embodiment

Figure 7A:
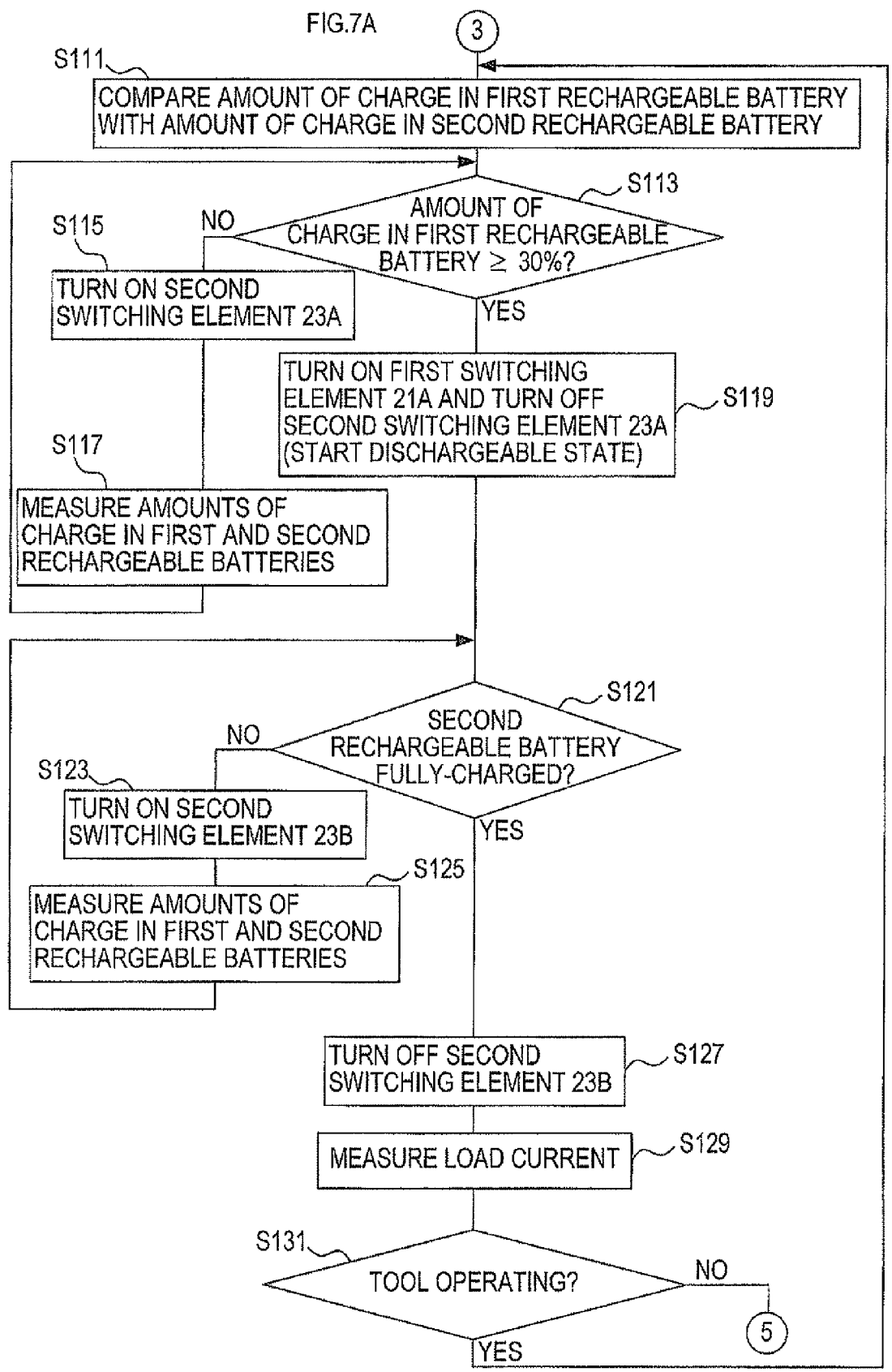
FIG. 7A is a flowchart showing a part of a charge control process of a power supply device according to a third embodiment of the present invention.

The third embodiment is a modified example of the above-described second embodiment. The charge control process performed in the power supply device 10 in the third embodiment is different from the charge control process (FIGS. 6B and 6C) in the second embodiment in a part of the process after it is determined in S55 that the adapter 11 is connected to the electric power tool 1 (S55: YES). Hereinafter, the part of the charge control process, which is performed in the power supply device 10 after it is determined in S55 that the adapter 11 is connected to the electric power tool 1 (S55: YES), will be explained with reference to FIGS. 7A and 7B.

1. Operation of the Power Supply Device

If it is determined in S55 that the adapter 11 is connected to the electric power tool 1 (S55: YES), the amount of charge in the first rechargeable battery 15A and the amount of charge in the second rechargeable battery 15B are compared with each other, and one of the rechargeable batteries which has a larger amount of charge is selected (S111). Hereinafter, explanations will be given on the assumption that the first rechargeable battery 15A is selected, in S111, as the rechargeable battery having the larger amount of charge.

Next, it is determined whether or not the amount of charge in the first rechargeable battery 15A is greater than or equal to 30% of that in the fully-charged state (S113). If it is determined that the amount of charge is less than 30% of that in the fully-charged state (S113: NO), the second switching element 23A for the first rechargeable battery 15A is turned on (S115).

Then, the amount of charge in the first rechargeable battery 15A and the amount of charge in the second rechargeable battery 15B are measured (S117); thereafter, S113 is executed again. If it is determined that the amount of charge in the first rechargeable battery 15A is greater than or equal to 30% of that in the fully-charged state (S113: YES), the second switching element 23A for the first rechargeable battery 15A is turned off and also, the first switching element 21A for the first rechargeable battery 15A is turned on (S119), thereby making it possible to supply an electric power to the electric power tool 1 from the first rechargeable battery 15A.

Next, it is determined whether or not the second rechargeable battery 15B is in the fully-charged state (S121). If it is determined that the second rechargeable battery 15B is not in the fully-charged state (S121: NO), the second switching element 23B for the second rechargeable battery 15B is turned on so as to start charging to the second rechargeable battery 15B (S123). Thereafter, the amount of charge in the first rechargeable battery 15A and the amount of charge in the second rechargeable battery 15B are measured (S125). Then, S121 is executed again.

On the other hand, if it is determined that the second rechargeable battery 15B is in the fully-charged state (S121: YES), the second switching element 23B for the second rechargeable battery 15B is turned off to suspend the charging to the second rechargeable battery 15B (S127). Thereafter, based on a detected value by the current detector 19, an electric power which is supplied to the electric power tool 1, i.e., a load current, is measured (S129).

Next, whether or not the electric power tool 1 is operating is determined based on a value of the load current measured in S129 (S131). If it is determined that the electric power tool 1 is operating (S131: YES), S111 is executed again.

For this reason, if the amount of charge in the first rechargeable battery 15A is greater than the amount of charge in the second rechargeable battery 15B, the first rechargeable battery 15A is continuously selected to be the rechargeable battery 15 as the source of discharge. However, if the amount of charge in the first rechargeable battery 15A is below the amount of charge in the second rechargeable battery 15B, the second rechargeable battery 15B is selected to be the rechargeable battery 15 as the source of discharge.

On the other hand, if it is determined in S131 that the electric power tool 1 is not operating (S131: NO), the first switching element 21 for the rechargeable battery 15 which has been selected in S111 as the source of discharge (in this case, the first switching element 21A for the first rechargeable battery 15A) is turned off (S133). Thereafter, the amount of charge in the rechargeable battery 15 selected as the source of discharge (hereinafter, described as the first rechargeable battery 15A) is measured (S135).

Then, it is determined whether or not the first rechargeable battery 15A is in the fully-charged state (S137). If it is determined that the first rechargeable battery 15A is not in the fully-charged state (S137: NO), the second switching element 23A for the first rechargeable battery 15A is turned on so as to start charging to the first rechargeable battery 15A (S139). Thereafter, S133 is executed again.

Thereafter, if it is determined that the first rechargeable battery 15A is in the fully-charged state (S137: YES), the first switching element 21 and the second switching element 23 are turned off (S141), and then, the present charge control process is terminated.

2. Features of the Power Supply Device According to the Third Embodiment

In the third embodiment, when the rechargeable battery 15 selected as the object to be charged reaches the fully-charged state, this rechargeable battery 15 selected as the object to be charged is set as the source of discharge. For this reason, the rechargeable battery 15 can be efficiently charged and discharged while suppressing reduction of the battery life of the rechargeable battery 15.

3. Corresponding Relationship Between Matters Specifying the Invention and the Third Embodiment In the third embodiment, the controller 25 is an example of a selecting unit and an example of an upper-limit-reach determination unit in the present invention.

Other Embodiments

In the above-described embodiments, the connection terminal of the battery pack 1A and the connection terminal of the rechargeable battery 15 have the same arrangement and shape so as to maintain compatibility. However, the present invention should not be limited to this arrangement and shape.

Although the rechargeable battery 15 is provided in the above-described embodiments, the present invention should not be limited to this configuration.

In the above-described embodiments, the present invention is applied to the electric power tool 1 which is pistol-shaped. However, the present invention should not be limited to the aforementioned application, and can be applied to, for example, a gardening tool such as a lawn mower, etc.

Although, in the above-described embodiments, the direct methanol fuel cell (DMFC) is adopted as the fuel cell 13, the present invention should not be limited to this DMFC.

Moreover, in the second and third embodiments, it is configured that charging is performed in the first charging mode regardless of whether or not the adapter 11 is connected to the electric power tool 1. However, the present invention should not be limited to this configuration, and the charge operation modes may be changed depending on whether or not the adapter 11 is connected to the electric power tool 1 in the same manner as in the first embodiment.

In the above-described embodiments, the lithium-ion battery is used as the rechargeable battery 15. However, the present invention should not be limited to this use, and, for example, an electricity storage unit such as a capacitor, etc. may be used.

Moreover, in the first embodiment, respective absolute values of the charge current value and the charge voltage value for the second charging mode are set to be values lower than respective absolute values of the charge current value and the charge voltage value for the first charging mode. However, the present invention should not be limited to the values set as above. The absolute value of any one of the charge current value and the charge voltage value for the second charging mode may be set to be a value lower than an absolute value of corresponding one of the charge current value and the charge voltage value for the first charging mode.

The present invention should not be limited to the above-described embodiments, and can be made in any manner which is consistent with a gist of the invention described in the claims.

The invention claimed is:

1. A power supply device for electric power tool that is configured to supply an electric power to an electric power tool, the power supply device comprising:
   an adapter configured to be electrically connected to the electric power tool in a detachable manner from the electric power tool;
   a fuel cell configured to generate an electric power to be supplied to the electric power tool through the adapter, by causing an oxidation reaction between a fuel and an oxidant;
   a charge unit configured to supply the electric power generated in the fuel cell to charge a rechargeable battery, the rechargeable battery to be connected to the electric power tool to supply the electric power to the electric power tool; and
   a connection determination unit configured to determine whether or not the adapter is connected to the electric power tool,
   wherein the charge unit is provided with a plurality of charge operation modes including a first charging mode and a second charging mode,
   wherein the first charging mode is performed when the connection determination unit determines that the adapter is not connected to the electric power tool, and
   wherein the second charging mode is performed when the connection determination unit determines that the adapter is connected to the electric power tool.

2. The power supply device according to claim 1, further comprising at least one electricity storage unit which includes:
   an electricity storage function to store the electric power supplied from the fuel cell; and
   an electricity discharge function to supply the electric power to the electric power tool through the adapter.

3. The power supply device according to claim 2,
   wherein the at least one electricity storage unit is charged by the charge unit.

4. The power supply device according to claim 2,
   wherein the at least one electricity storage unit is a plurality of electricity storage units,
   wherein the power supply device includes a selecting unit configured to select, among the plurality of electricity storage units, the electricity storage unit which performs electric discharge by the electricity discharge function and the electricity storage unit which is to be charged by the electricity storage function.

5. The power supply device according to claim 4, further comprising a lower-limit-reach determination unit configured to determine whether or not an electric power, which is stored in the electricity storage unit selected as a source of discharge by the selecting unit, has reached a pre-set lower limit,
   wherein the selecting unit is configured to set the electricity storage unit selected as the source of discharge, as an object to be charged, when the lower-limit-reach determination unit determines that the electric power stored in the electricity storage unit selected as the source of discharge has reached the lower limit.

6. The power supply device according to claim 4, further comprising an upper-limit-reach determination unit configured to determine whether or not an electric power, which is stored in the electricity storage unit selected as an object to be charged by the selecting unit, has reached a pre-set upper limit,
   wherein the selecting unit is configured to set the electricity storage unit selected as the object to be charged, as a source of discharge, when the upper-limit-reach determination unit determines that the electric power stored in the electricity storage unit selected as the object to be charged has reached the upper limit.

7. The power supply device according to claim 1,
   wherein the second charging mode is the charge operation mode in which charging is performed at one of a voltage value lower than a voltage value in the first charging mode and a current value smaller than a current value in the first charging mode.

8. A power supply device for electric power tool that is configured to supply an electric power to an electric power tool, the power supply device comprising:
   an adapter configured to be electrically connected to the electric power tool;
   a fuel cell configured to generate an electric power to be supplied to the electric power tool through the adapter, by causing an oxidation reaction between a fuel and an oxidant;
   at least one electrical connection portion configured such that at least one rechargeable battery is attachable thereto, the at least one rechargeable battery being configured to be connected to the electric power tool to supply the electric power to the electric power tool; and
   a charge unit configured to supply the electric power generated in the fuel cell to charge the at least one rechargeable battery, when the electric power tool is operating.

9. The power supply device according to claim 8,
   wherein the charge unit is configured to supply the electric power generated in the fuel cell to charge the at least one rechargeable battery, when the electric power stored in the at least one rechargeable battery has reached a pre-set lower limit while the electric power tool is operating.

10. A power supply device for electric power tool that is configured to supply an electric power to an electric power tool, the power supply device comprising:
    an adapter configured to be electrically connected to the electric power tool;
    a fuel cell configured to generate an electric power to be supplied to the electric power tool through the adapter, by causing an oxidation reaction between a fuel and an oxidant;
    at least one electrical connection portion configured such that at least one rechargeable battery is attachable thereto, the at least one rechargeable battery being configured to be connected to the electric power tool to supply the electric power to the electric power tool; and
    a charge unit configured to start supplying the electric power generated in the fuel cell to charge the at least one rechargeable battery at one of a first timing and a second timing, the first timing being a timing at which the adapter is attached to the electric power tool, and the second timing being a timing at which the adapter is detached from the electric power tool.

\* \* \* \* \*